(12) United States Patent
Hiraga et al.

(10) Patent No.: US 9,417,274 B2
(45) Date of Patent: Aug. 16, 2016

(54) ELECTRIC CIRCUIT EVALUATION METHOD

(71) Applicant: ROHM CO., LTD., Kyoto (JP)

(72) Inventors: Noriaki Hiraga, Kyoto (JP); Katsunori Kido, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 142 days.

(21) Appl. No.: 14/301,536

(22) Filed: Jun. 11, 2014

(65) Prior Publication Data

US 2014/0368225 A1    Dec. 18, 2014

(30) Foreign Application Priority Data

Jun. 14, 2013    (JP) .................................. 2013-125842

(51) Int. Cl.
   *G01R 31/00*    (2006.01)

(52) U.S. Cl.
   CPC .................................... *G01R 31/002* (2013.01)

(58) Field of Classification Search
   CPC ............. G01R 31/2879; G01R 31/312; G01R 27/2605; G01N 15/0227
   USPC ...................................................... 324/750.01
   See application file for complete search history.

(56) References Cited

U.S. PATENT DOCUMENTS

2009/0277278 A1*  11/2009  Koudal et al. .............. 73/861.08
2014/0266238 A1*  9/2014   Furse et al. .................... 324/533

FOREIGN PATENT DOCUMENTS

JP    2007278781 A    10/2007
JP    2009210322 A    9/2009

* cited by examiner

*Primary Examiner* — Melissa Koval
*Assistant Examiner* — Trung Nguyen
(74) *Attorney, Agent, or Firm* — Cantor Colburn LLP

(57) ABSTRACT

The electric circuit evaluation method according to the present invention is characterized in that a designated electric circuit is placed inside a shield structure, a noise signal for a malfunction test is inputted to the designated electric circuit, a short-circuit is established between a ground of the shield structure and a ground of a noise source for inputting a noise signal for a malfunction test to the designated electric circuit, and the ground of the designated electric circuit and the ground of the shield structure are isolated.

10 Claims, 14 Drawing Sheets

ELECTRIC CIRCUIT EVALUATION METHOD

CROSS-REFERENCE TO RELATION APPLICATIONS

This application is based on the following Japanese application, the entire contents of which are incorporated by reference in the specification of this application. (1) Japanese Patent Application No. 2013-125842 (filing date: Jun. 14, 2013)

BACKGROUND OF THE INVENTION

1. Field of the Invention

The present invention relates to an electrical circuit evaluation method.

2. Description of Related Art

Direct RF power injection (DPI) tests are known in conventional practice as an electric circuit evaluation method.

Japanese Laid-open Patent Application No. 2007-278781 and Japanese Laid-open Patent Application No. 2009-210322 can be given as examples of conventional techniques relevant to such methods.

In conventional DPI tests, it has not been possible to make evaluations that reflect a state in which a designated electric circuit is actually used.

SUMMARY OF INVENTION

The present invention was devised in view of the above problem discovered by the inventors of the present application, and an object of the invention is to provide an electric circuit evaluation method whereby a malfunction evaluation can be made that reflects a state in which an electric circuit is actually used, as well as an electric circuit evaluated by this method.

An electric circuit evaluation method according to the present invention is characterized in that a designated electric circuit is placed inside a shield structure, a noise signal for a malfunction test is inputted to the designated electric circuit, a short-circuit is established between a ground of the shield structure and a ground of a noise source for inputting a noise signal for a malfunction test to the designated electric circuit, and a ground of the designated electric circuit and the ground of the shield structure are isolated.

The electric circuit according to the present invention is characterized in being provided together with a frequency property of the magnitude of the power at which a malfunction is caused when the electric circuit is placed inside a shield structure, a noise signal for a malfunction test is inputted, a ground short-circuited to a ground of the shield structure and isolated from a ground of the electric circuit being used as a reference.

Other characteristics, elements, steps, advantages, and properties of the present invention are further clarified by the detailed description of the preferred embodiments and the related accompanying drawings, continued below.

DETAILED DESCRIPTION OF PREFERRED EMBODIMENTS

DPI Test

First Configuration Example

Figure 1:
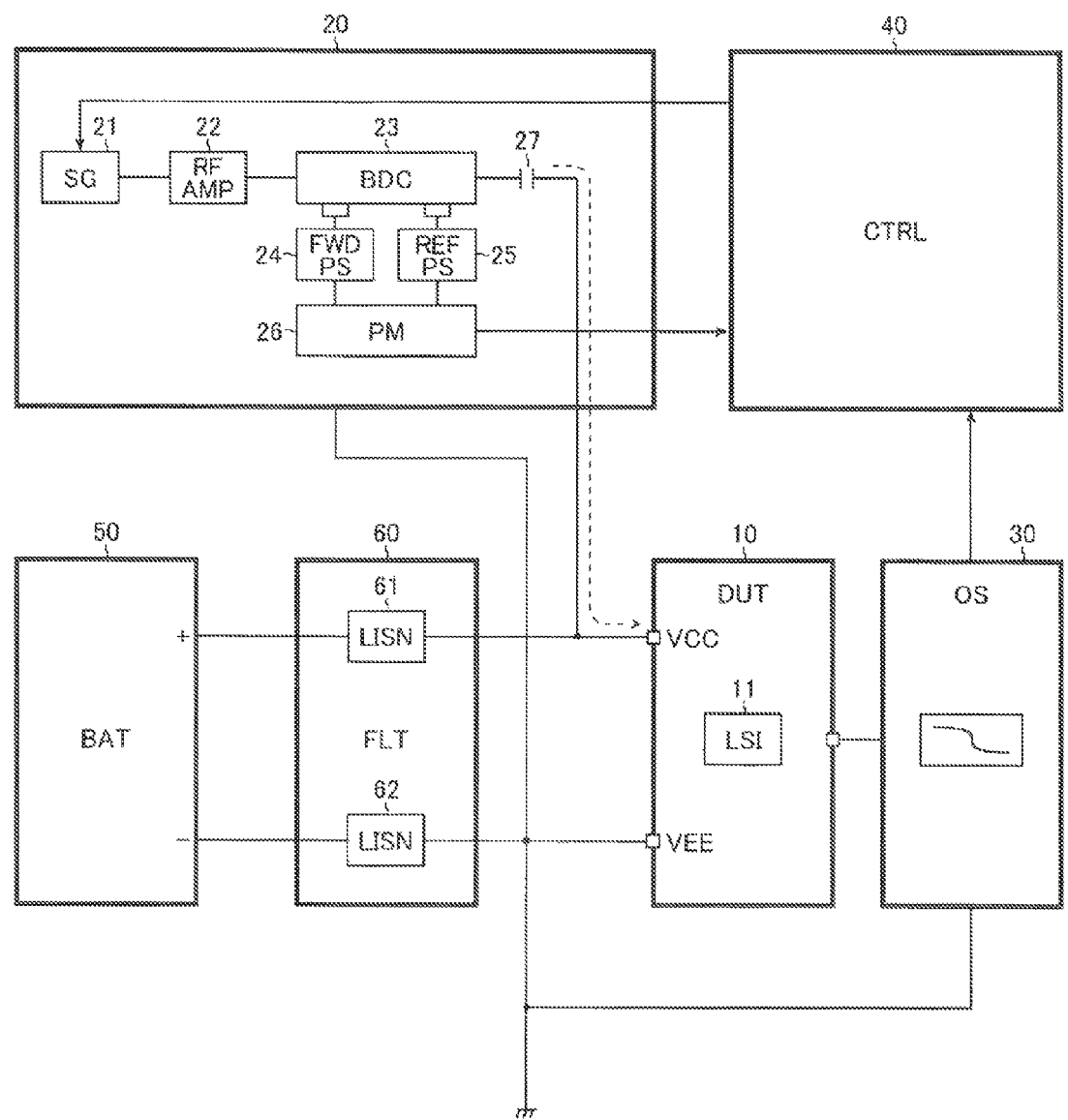
FIG. 1 is a block diagram showing a first configuration example of a DPI test.

FIG. 1 is a block diagram showing a first configuration example of a DPI test. A DPI test is one method (IEC62132-4) of verifying EMS (electromagnetic susceptibility) for a semiconductor integrated circuit, standardized by the International Electrotechnical Commission (TEC), and is carried out using a device under test 10 (referred to below as the DUT 10), as well as a noise source 20, a detection part 30, a controller 40, a battery 50, a power source filter 60, and the like.

The DUT 10 includes a designated electric circuit 11 (referred to below as the LSI 11), a printed circuit board (PCB) on which the LSI is installed. The LSI 11 alone can also of course be used as the DUT 10. The DUT 10 does not need to be a real device, and mock devices for testing are commonly used.

When a plurality of LSIs are compared to each other (for example, a new-model LSI and an old-model LSI are compared, or an LSI of one's own company and a compatible LSI of another company are compared), it is preferable to use a mock device for testing that has common configurative elements (the size and wiring pattern of the PCB, the type and properties of discreet components installed on the PCB, etc.) other than the LSIs being evaluated.

The noise source 20, which is a main element for injecting high-frequency noise signals (interference power) into the terminals (a power source terminal VCC is shown in FIG. 1) of the DUT 10, includes a signal generator 21, an RF amplifier 22, a bi-directional coupler 23, a forward wave power sensor 24, a reflected wave power sensor 25, a power meter 26, and a coupling capacitor 27.

The signal generator (SG) 21 generates a high-frequency noise signal in the form of a sine wave. The oscillation frequency and amplitude of the high-frequency noise signal can be controlled by the controller 40. When the interfering wave is a pulse, a pulse generator (PG) may be used, and when the interfering wave is an impulse, an impulse generator (IG) may be used.

The RF (radio frequency) amplifier 22 amplifies the high-frequency noise signal generated by the signal generator 21 at a predetermined gain.

The bi-directional coupler (BDC) 23 separates the high-frequency noise signal amplified by the RF amplifier 22 into forward wave component that goes to the DUT 10 and a reflected wave component that returns from the DUT 10.

The forward wave power sensor 24 measures the power of the forward wave component separated by the bi-directional coupler 23. The reflected wave power sensor 25 measures the power of the reflected wave component separated by the bi-directional coupler 23. The transmission lines to the forward wave power sensor 24 and the reflected wave power sensor 25 are preferably kept in a pseudo-isolated state (for example, an impedance of 50Ω or more and a power transmission property of −20 dBm or less).

The power meter 26 sends to the controller 40 the forward wave power measured by the forward wave power sensor 24 and the reflected wave power measured by the reflected wave power sensor 25. The power actually injected into the DUT 10 is calculated by a difference computation by the controller 40, and the calculation result is recorded in the controller 40. Thus, the power injected into the DUT 10 is measured by the power meter 26, which is separate from the DUT 10. Therefore, to measure the power injected into the DUT 10 with high precision, the cable loss during high-frequency noise signal transmission is preferably reduced to as small of a value as possible (1 dB or less, for example).

The coupling capacitor 27, which is connected between the output terminal of the bi-directional coupler 23 and the DUT 10, cuts out the DC component to allow transmission of only the AC component (the high-frequency noise signal). In FIG. 1, the coupling capacitor 27 is portrayed as a configurative element of the noise source 20, but there are many cases in which a ceramic capacitor instead is placed on the PCB equipped with the LSI 11.

The detection part 30 observes the output waveform of the DUT 10 and sends the observation result to the controller 40. An oscilloscope or the like can be suitably used as the detection part 30. A differential probe of high-input impedance (1 MΩ) is preferably used to put the transmission line from the DUT 10 to the detection part 30 in a pseudo-isolated state so that the presence of the detection part 30 does not affect the DPI test.

The controller 40 is a main element for collectively controlling the DPI test. When the DPI test is carried out, the controller 40 keeps constant the oscillation frequency of the high-frequency noise signal injected into the DUT 10, for example, and controls the signal generator 21 so that the amplitude (injected power) of the high-frequency noise signal gradually increases. The controller 40 performs a LSI 11 malfunction determination (a determination of whether or not there has been a pulse omission or frequency disturbance in the clock signal, a deviation from the standard output voltage, a communication error, or the like) according to the observation result of the detection part 30, in parallel with the amplitude control described above. The controller 40 then acquires the result of computing the value measured by the power meter 26 (the power injected into the DUT 10) at the point in time when the LSI 11 malfunction occurred, and stores this result associated with the oscillation frequency of the current setting. By thereafter repeating this measurement while sweeping the oscillation frequency of the high-frequency noise signal, the controller 40 attempts to find the malfunction power frequency property, which is the association between the oscillation frequency of the high-frequency noise signal and the injected power at the time the malfunction occurred. A personal computer or the like that can sequentially carry out the above-described measurement can be suitably used as the controller 40.

The battery 50 is a DC power source for supplying power to the DUT 10. When the evaluation target of the DPI test is an onboard LSI, for example, an onboard battery may be used as the battery 50. The DC power source for the DUT 10 is not limited to a battery, and can also be an AC/DC converter or the like for generating the desired DC power from applied AC power.

The power source filter 60, which is a circuit part for putting the transmission line from the noise source 20 to the battery 50 into a pseudo-isolated state, includes power source impedance stabilization circuit networks 61 and 62 (referred to below as LISNs (line impedance stabilization networks) 61 and 62). The LISNs 61 and 62 both stabilize the apparent impedance of the battery 50. The LISN 61 is inserted into the power source line connecting a positive electrode terminal (+) of the battery 50 and a power source terminal (VCC) of the DUT 10, and the LISN 62 is inserted into a GND line connecting a negative electrode terminal (−) of the battery 50 and a GND terminal (VEE) of the DUT 10.

<DPI Test Result (Malfunction Power Frequency Property)>

Figure 2:
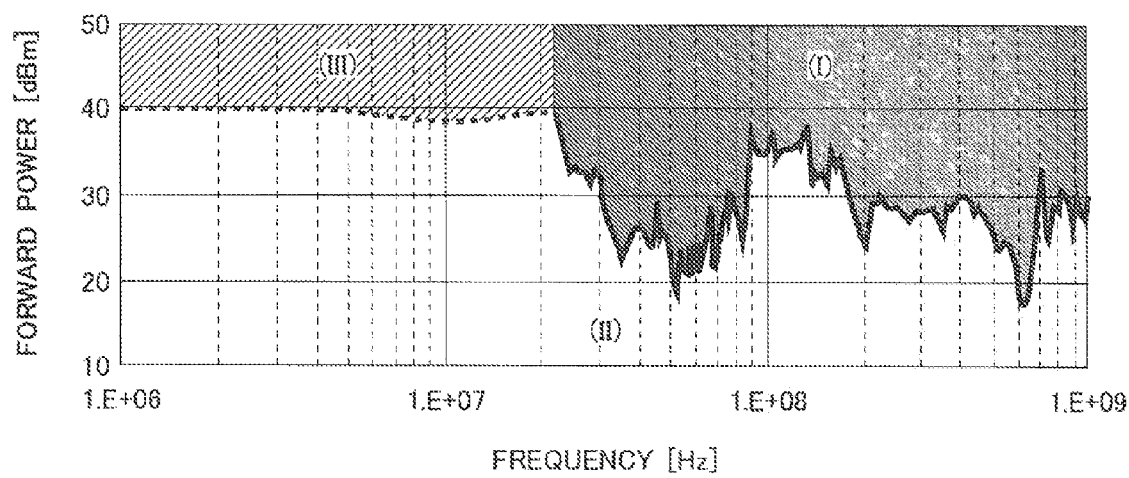
FIG. 2 is a graph showing an example of a DPI test result (malfunction power frequency property)

FIG. 2 is a graph showing an example of a DPI test result (malfunction power frequency property). The horizontal axis of the graph represents the oscillation frequency [Hz] of the high-frequency noise signal, and the vertical axis represents the injected power [dBm] of the high-frequency noise signal. This graph plots the critical injected power at which the LSI 11 causes a malfunction at each oscillation frequency of the high-frequency noise signal as the result of the DPI test (refer to the solid line in the graph). Specifically, the solid line in the graph the malfunction boundary, the area (I) above the solid line is therefore a malfunctioning area, and the area (II) below the solid line is a normally functioning area.

A predetermined maximum power (38 to 40 dBm, for example) is provisionally plotted at oscillation frequencies that do not cause a malfunction even when the aforementioned maximum power is injected (refer to the dashed line in the graph). Specifically, the dashed line in the drawing is the normal function ensuring boundary, the area (III) above the dashed line is therefore a non-ensuring area, and the area (II) below the dashed line is a normally functioning area.

Thus, the DPI test attempts to find the malfunction power frequency property, which is the magnitude of the critical high-frequency noise signal at which the DUT 10 causes a malfunction, represented by the power injected into the DUT 10. As stated in the background art paragraph, the malfunction power frequency property is information that is easily acquired, but has been difficult to treat as information for improving events that occur in the actual LSI 11.

In view of this, below is a proposal of an electric circuit evaluation method which, in addition to having a step for finding the above-described malfunction power frequency property through a DPI test, also has a step for finding a malfunction current frequency property, which is the magnitude of the critical high-frequency noise signal at which the LSI 11 causes a malfunction, represented by a terminal current I_LSI flowing to a predetermined portion of the LSI 11, and a malfunction voltage frequency property, which is the magnitude of the critical high-frequency noise signal at which the LSI 11 causes a malfunction, represented by a terminal voltage V_LSI occurring between predetermined points of the LSI 11, both of which properties found from the malfunction power frequency property.

When the evaluation method is carried out, the S-(scattering) parameters of the DUT 10 and the LSI 11 are measured to make the LSI 11 an equivalent circuit and to conduct an AC analysis, and the IBs (immunity behaviors) of the terminal current I_LSI and the terminal voltage V_LSI are simulated (the malfunction current frequency property and the malfunction voltage frequency property are acquired) based on the analysis result. These element steps are sequentially described in detail below.

<S-Parameter Measurement>

Figure 3:
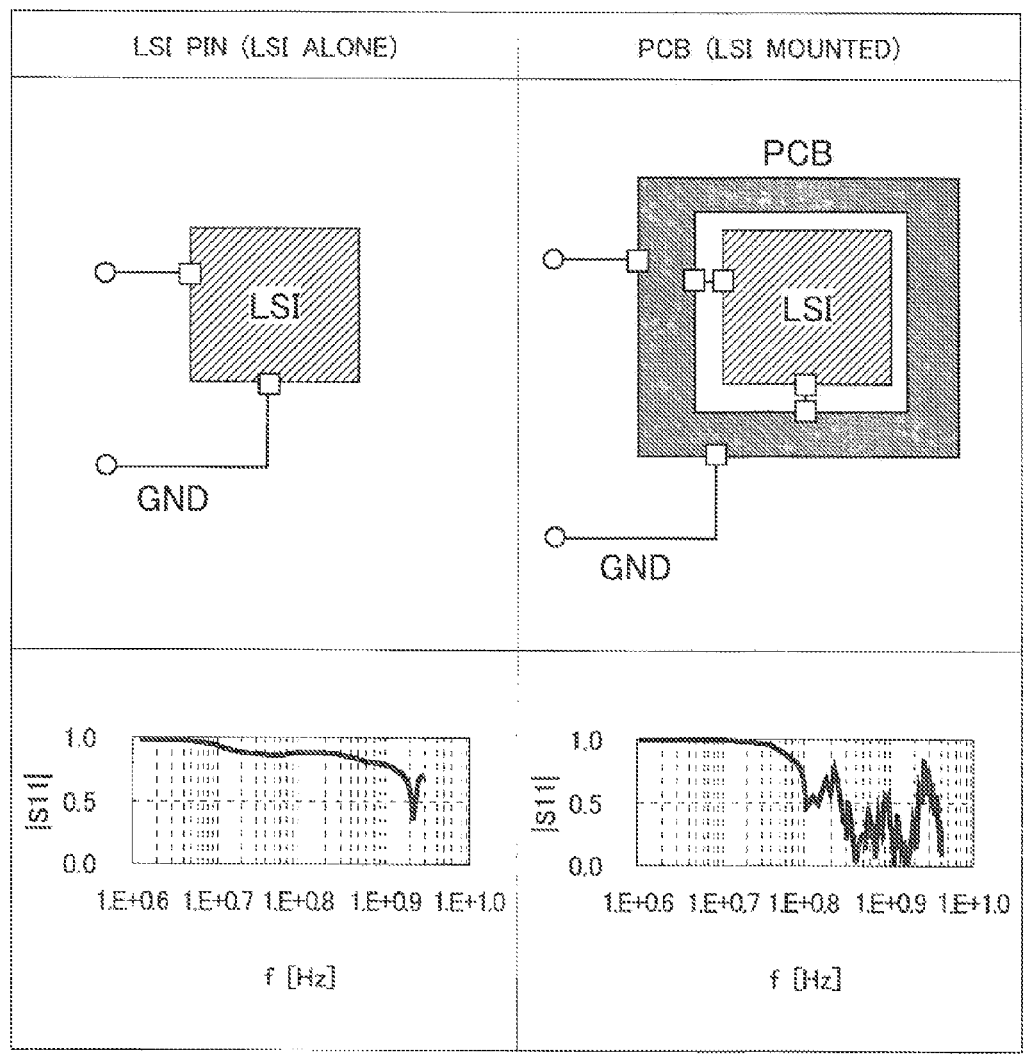
FIG. 3 is a chart showing an example of S-parameter measurement.

FIG. 3 is a chart showing an example of S-parameter measurement. S-parameters are parameters representing frequency properties of the DUT 10 or LSI 11, and S-parameters show power transmission properties or power reflection properties of the circuit network. For example, the S-parameter |S11| shown in FIG. 3 shows the percentage of signals reflected back to a first terminal (reflectance loss) when signals are inputted from the first terminal in a two-terminal circuit (a four-terminal circuit network). In addition to the reflectance loss of the first terminal (|S11|), also measured in the two-terminal circuit are insertion loss from the first terminal to a second terminal (|S21|), insertion loss from the second terminal to the first terminal (|S12|), and reflectance loss of the second terminal (|S22|). The S-parameters of the LSI 11 are preferably measured with the LSI alone, and the S-parameters of the DUT 10 are preferably measured with the LSI mounted on the DUT.

<Making Equivalent Circuit>

Figure 4:
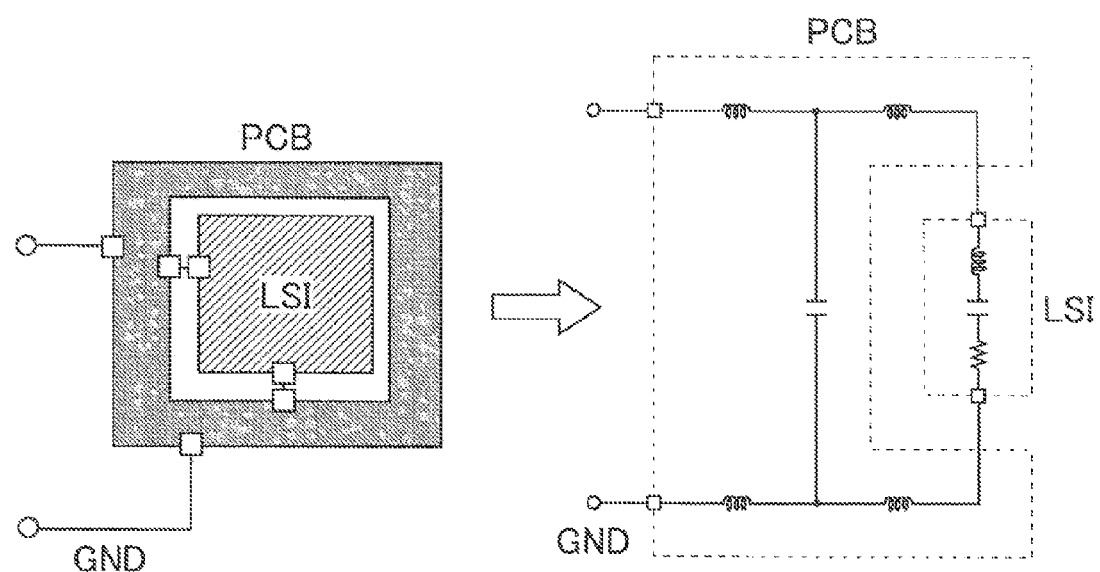
FIG. 4 is a drawing showing an example of making an equivalent circuit.

FIG. 4 is a drawing showing an example of making an equivalent circuit. Making an equivalent circuit from the LSI 11 and the PCB equipped with the LSI is done from the S-parameters of the DUT 10 and the LSI 11. When an equivalent circuit is made, the LSI 11 is preferably regarded as a series circuit having a resistor R, an inductor L, and a capacitor C, and the PCB is preferably represented as the components (capacitor C and the like) installed with the inductor L of the wiring pattern.

<AC Analysis>

Figure 5:
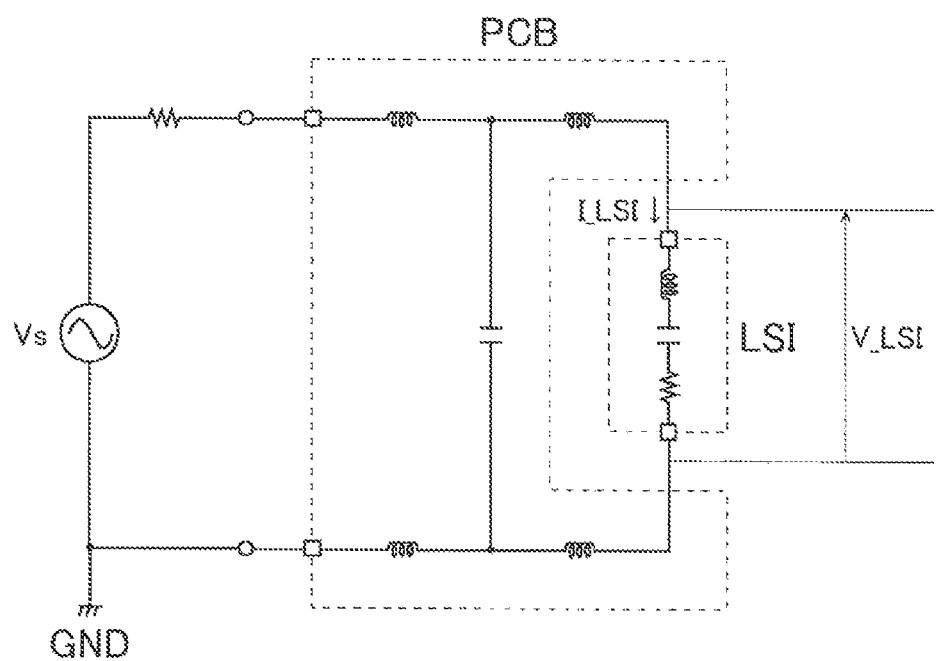
FIG. 5 is a drawing showing an example of the AC analysis.

FIG. 5 is a drawing showing an example of the AC analysis. An AC analysis is performed on the equivalent circuit of the LSI 11 and the PCB equipped with the LSI. A 50Ω AC voltage source is preferably used as the AC signal source for generating AC voltage Vs (Vrms). At this time, the terminal current I_LSI flowing to a predetermined portion of the LSI 11 and the terminal voltage V_LSI occurring between predetermined points of the LSI 11 can both be expressed as functions of the AC voltage Vs, as shown in the following formulas (1a) and (1b).

$$I\_LSI = fI(Vs) \quad (1a)$$

$$V\_LSI = fV(Vs) \quad (1b)$$

The following formula (2) is established between the AC voltage Vs generated by the AC signal source and the injected power Pi sent to the LSI 11.

$$Pi = Vs^2/200 \quad (2)$$

Therefore, when formula (2) is substituted into formulas (1a) and (1b), the terminal current I_LSI and the terminal voltage V_LSI can be expressed as functions of the injected power Pi, as shown respectively in the following formulas (3a) and (3b).

$$I\_LSI = fI(Vs) = fI(\sqrt{(Pi \times 200)}) = gI(Pi) \quad (3a)$$

$$V\_LSI = fV(Vs) = fv(\sqrt{(Pi \times 200)}) = gV(Pi) \quad (3b)$$

Possible examples of the predetermined portion to which the terminal current I_LSI flows include a signal input terminal of the LSI 11, a signal output terminal, a signal input/output terminal, a power source terminal, a GND terminal, a heat-radiating fin plate, and the like. Because malfunctioning in the LSI 11 is particularly likely when a high-frequency noise signal is inputted to a signal input terminal of the LSI 11, it is extremely important to find the malfunction current frequency property or malfunction voltage frequency property of the signal input terminal.

<IB Simulation (Malfunction Current/Voltage Frequency Properties)>

Figure 6:
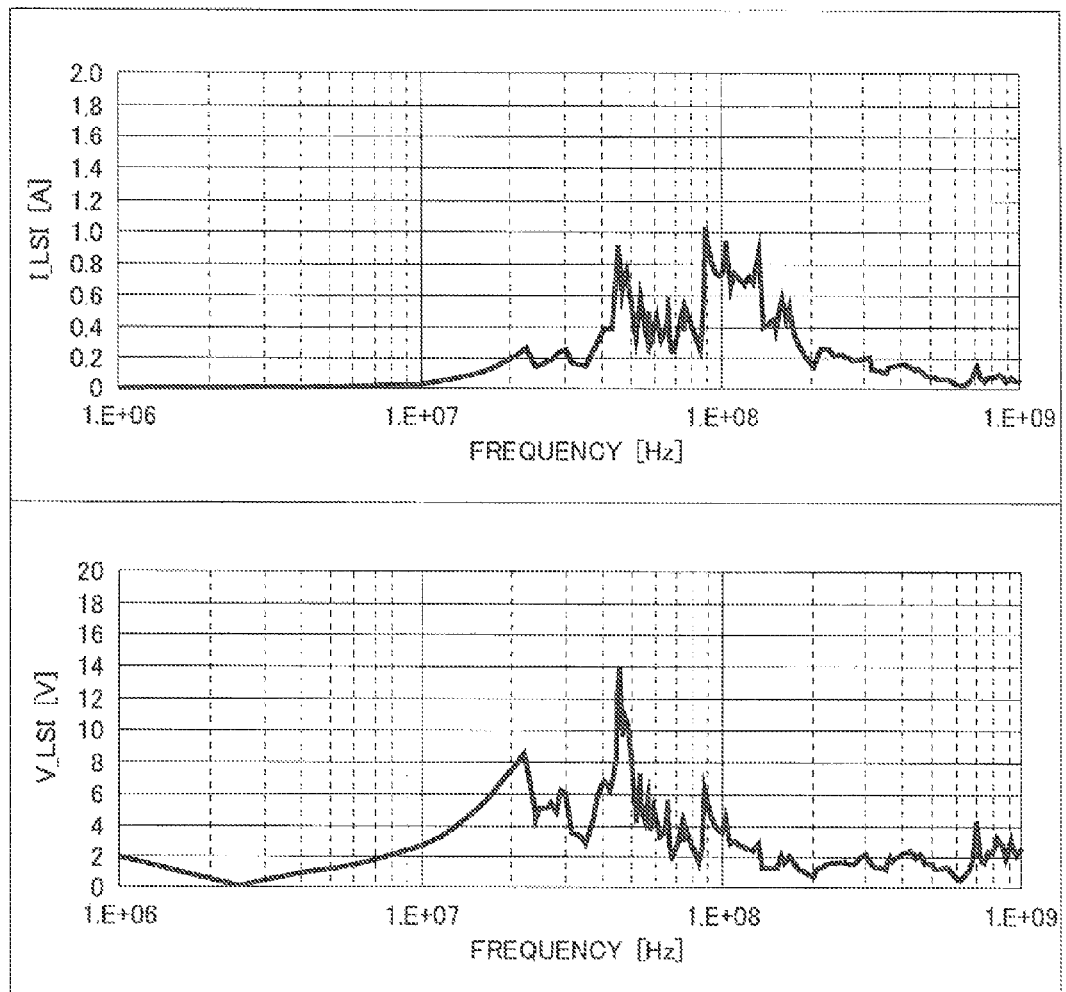
FIG. 6 is a graph showing an example of the malfunction current frequency property/malfunction voltage frequency property.

FIG. 6 is a graph showing an example of the malfunction current frequency property and the malfunction voltage frequency property. When the DPI test results (the critical injected power Pi at which the LSI 11 causes a malfunction) are substituted into the previous formulas (3a) and (b), the critical terminal current I_LSI and terminal voltage V_LSI at which the LSI 11 causes a malfunction are obtained for each oscillation frequency of the high-frequency noise signal.

Thus, in the electric circuit evaluation method according to the present invention, the malfunction power frequency property is a property of the DUT 10, and the malfunction current frequency property and the malfunction voltage frequency property are frequency properties of the LSI 11 extracted from the malfunction power frequency property. In this case, the malfunction current frequency property and malfunction voltage frequency property described above are extracted based on the malfunction power frequency property of the DUT 10, the equivalent circuit of the DUT 10, and the equivalent circuit of the LSI 11.

Data pertaining to the malfunction current frequency property and the malfunction voltage frequency property are preferably provided to the user along with the LSI 11. This providing of data makes it possible for the user to easily avoid LSI 11 malfunctions.

<Comparison of Arriving Current/Voltage Frequency Properties>

Figure 7:
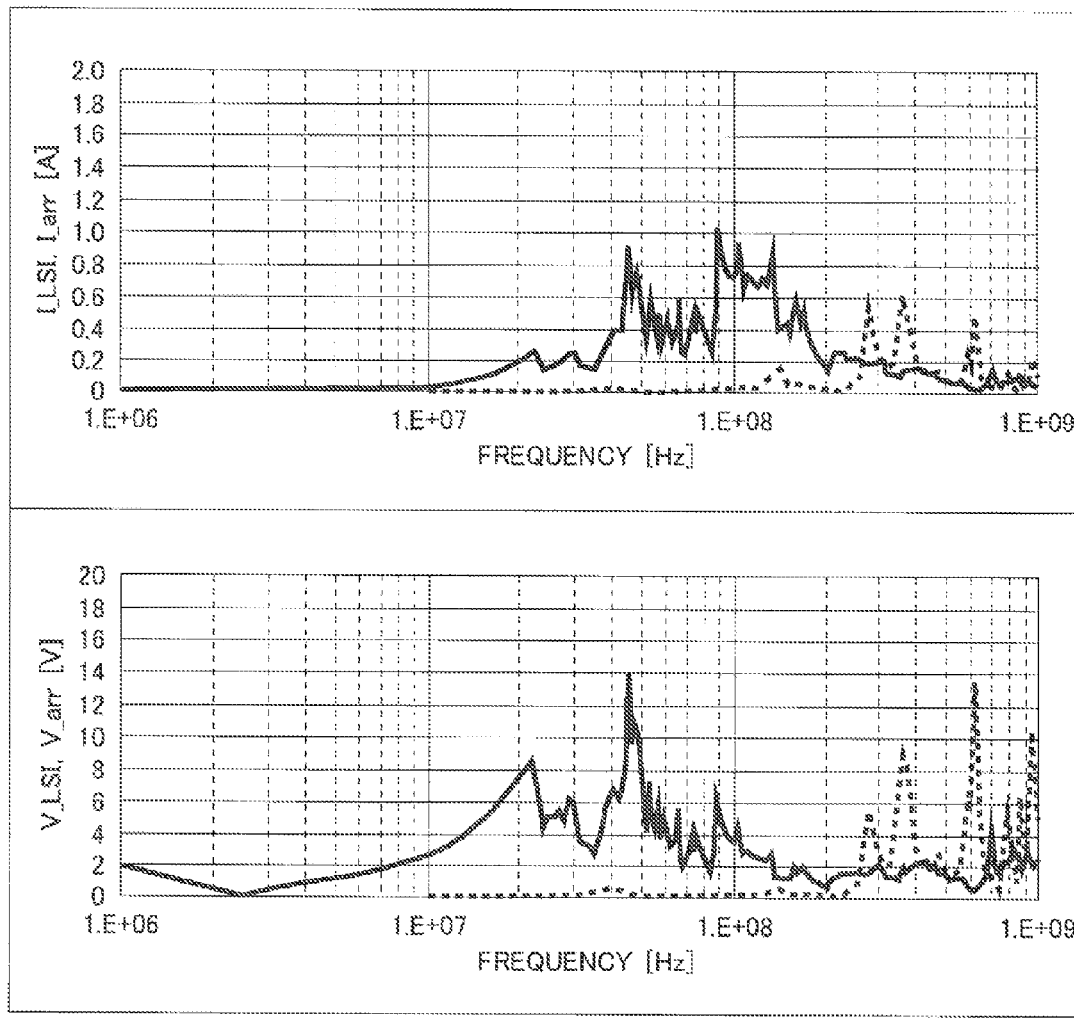
FIG. 7 is a graph showing a comparative example of arriving current/voltage frequency properties.

FIG. 7 is a graph showing an example comparing the malfunction current frequency property and malfunction voltage frequency property shown in FIG. 6 (solid lines), and an arriving current frequency property and arriving voltage frequency property (dashed lines). The arriving current frequency property is a frequency property of an arriving current I_arr that arrives at the predetermined portion of the LSI 11 when a predetermined immunity test (details described hereinafter) is performed on a to-be-measured circuit unit including the LSI 11 or a mock unit thereof. The arriving voltage frequency property is a frequency property of an arriving voltage V_arr that arrives between the predetermined points of the LSI 11 when the aforementioned immunity test is performed.

Thus, to apply the previously found malfunction current frequency property and malfunction voltage frequency property of the LSI 11 to an EMS evaluation, the electric circuit evaluation method according to the present invention has step of comparing these properties with the arriving current frequency property and the arriving voltage frequency property of the LSI 11. Making this comparison makes it possible to assess that the LSI 11 could cause a malfunction at the oscillation frequencies at which the dashed lines in FIG. 7 rise above the solid lines, for example. When the same comparison is made with each terminal of the LSI 11, it is possible to specify terminals that could cause a malfunction, and circuit design can therefore be quickly improved.

Because of this, under the condition of using the same LSI 11, it is possible to estimate whether or not the LSI 11 will cause a malfunction by calculating the terminal current I_LSI and the terminal voltage V_LSI, even when the PCB structure or noise injection method (test method) has changed.

The arriving current frequency property and the arriving voltage frequency property of the LSI 11 are found by a simulation on the basis of on an equivalent circuit of the to-be-measured circuit unit equipped with the LSI 11 or an equivalent circuit of a mock unit. When such a simulation is performed, a predetermined immunity test must be performed on the to-be-measured circuit unit or the mock unit.

When an onboard LSI is the evaluation target, for example, it is preferable to use a test compliant with ISO 11452 as the above-described immunity test. Possible examples of a test compliant with ISO 11452 include a radiated immunity test compliant with ISO 11452-2, a TEMCELL (transverse electromagnetic cell) test compliant with ISO 11452-3, a bulk current injection (BCI) test compliant with ISO 11452-4, and the like. A test compliant with a product immunity examination typified by ISO 7637 or the IEC 61000-4 series may be used as the above-described immunity test. A detailed description is given below, using a BCI test as an example.

<BCI Test>

Figure 8:
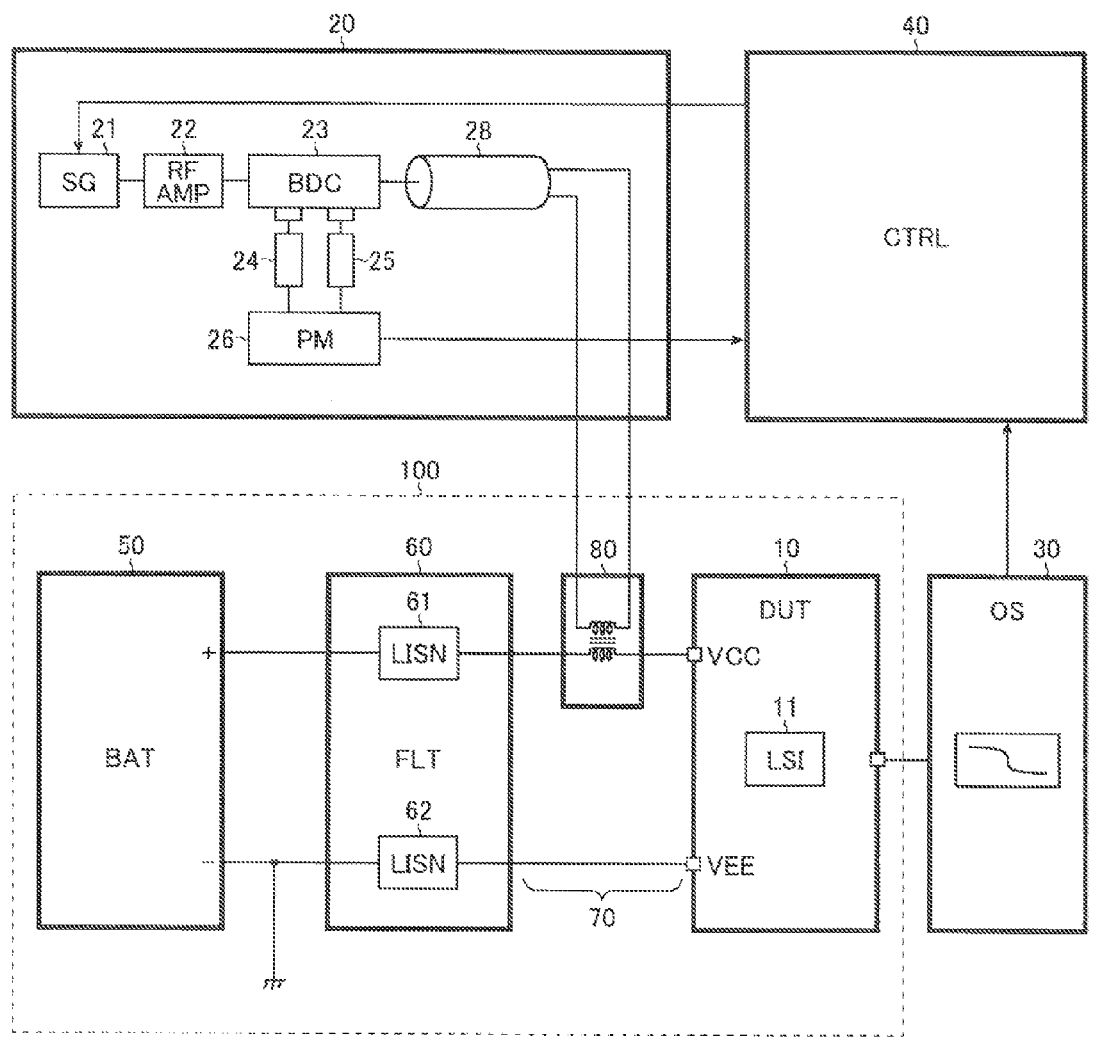
FIG. 8 is a block diagram showing a configuration example of a BCI test.

FIG. 8 is a block diagram showing a configuration example of a BCI test. A BCI test is one component testing method (EMS standards for products: ISO 11452-4), standardized by the international organization for standardization (ISO), for electric obstruction caused by narrowband electromagnetic radiation energy directed at onboard electronic devices.

The BCI test is a test conducted on a to-be-measured circuit unit 100 including the LSI 11 (or a mock unit thereof). Similar to the previous DPI test (see FIG. 1), the BCI test is conducted using a noise source 20, a detection part 30, a controller 40, a battery 50, a power source filter 60, and other components in addition to the DUT 10.

The to-be-measured circuit unit 100, which is equivalent to the actual product (an actual device) on which the LSI 11 is installed, includes a wire harness 70 of about 1.5 to 2.0 m electrically connecting the DUT 10 and the power source filter 60 together, in addition to the previously described DUT 10 and battery 50. An injection probe 80 is inserted into the wire harness 70, and bulk current is injected via a 50Ω transmission line 28 of the noise source 20.

When a BCI test is performed on the to-be-measured circuit unit 100, the arriving current frequency property and the arriving voltage frequency property of the LSI 11 are found by a simulation on the basis of on an equivalent circuit of the to-be-measured circuit unit 100.

When a BCI test is performed on a mock unit having a simplified to-be-measured circuit unit 100, the arriving current frequency property and the arriving voltage frequency property of the LSI 11 are found by a simulation on the basis of on both an equivalent circuit of the to-be-measured circuit unit 100 and an equivalent circuit of the mock unit.

These equivalent circuits are based on the S-parameters of the to-be-measured circuit unit 100 and the S-parameters of the LSI 11.

Thus, the electric circuit evaluation method according to the present invention comprises: a step for finding an arriving current frequency property representing the arriving current I_arr that arrives at the predetermined portion of the LSI 11 when a predetermined immunity test (e.g. a BCI test) is performed on the to-be-measured circuit unit 100 including the LSI 11, the arriving current frequency property being found through a simulation on the basis of on an equivalent circuit of the LSI 11 and an equivalent circuit of the to-be-measured circuit unit 100; and a step for finding an arriving voltage frequency property representing the arriving voltage V_arr that arrives between the predetermined points of the LSI 11 when the immunity test is performed, the arriving voltage frequency property being found through a simulation on the basis of on the equivalent circuit of the LSI 11 and the equivalent circuit of the to-be-measured circuit unit 100.

DPI Test

Second Configuration Example

Figure 9:
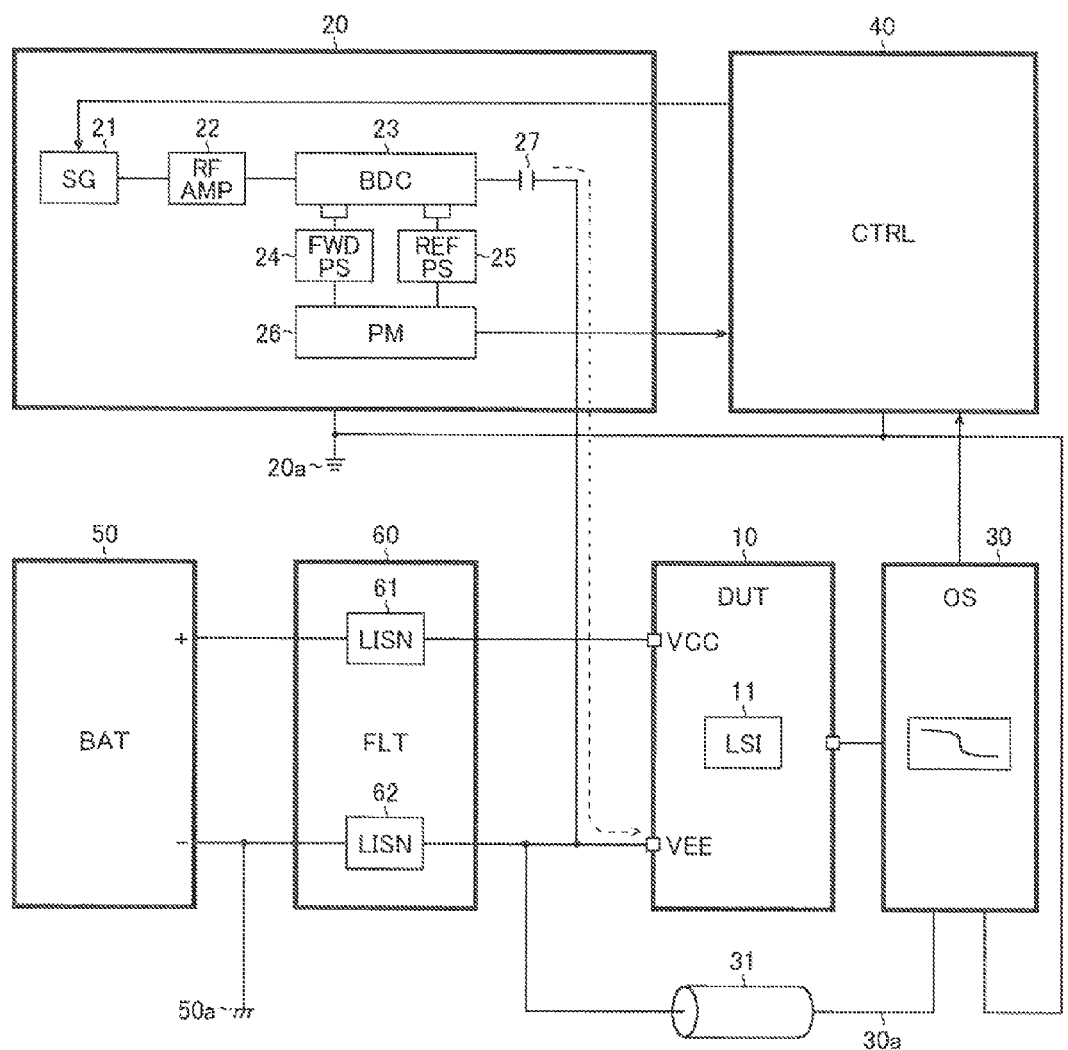
FIG. 9 is a block diagram showing a second configuration example of a DPI test.

FIG. 9 is a block diagram showing a second configuration example of a DPI test. The second configuration example is essentially the same as the previous first configuration example, but rather than inputting a high-frequency noise signal to the terminal of the DUT 10 with a ground reference, this example has the characteristics of inputting a high-frequency noise signal to the ground terminal VEE itself of the DUT 10 and finding the frequency property (the malfunction power frequency property) of the magnitude of the power at which the LSI 11 causes a malfunction. In view of this, configurative elements similar to the first configuration example are denoted by the same symbols in FIG. 1 whereby redundant descriptions are omitted, and the following description focuses on the characterizing portions of the second configuration example.

The first characteristic of the second configuration example of a DPI test is that a detection reference ground 30a of the detection part 30 for detecting whether or not the LSI 11 causes a malfunction is connected to the ground terminal VEE of the DUT 10 by a high-impedance component 31. This high-impedance component 31 is configured from a resistor (10 kΩ), for example), a coil, a ferrite bead, and the like.

When a high-frequency noise signal is injected into the ground terminal VEE of the DUT 10 and the detection reference ground 30a is connected at low impedance to the ground terminal VEE of the DUT 10 in order to obtain the reference potential of the detection part 30, the high-frequency noise signal is dispersed to the ground of the detection part 30, and the presence of the detection part 30 therefore affects the DPI test results. When the ground of the detection part 30 is completely insulated from the ground terminal VEE of the DUT 10, the output waveform cannot be accurately detected because the DUT 10 and the ground potential of the detection part 30 will not coincide.

In view of this, leaking of the high-frequency noise signal directed to the detection part 30 can be reduced by keeping the detection reference ground of the detection part 30 and the ground terminal VEE of the DUT 10 in a state of connection through the high-impedance component 31 (a pseudo-isolated state), and the problems described above can therefore be resolved.

The second characteristic of the second configuration example of a DPI test is that a ground 20a of the noise source 20 for inputting a high-frequency noise signal for a malfunction test to the DUT 10 is galvanically isolated from the ground terminal VEE of the DUT 10. In other words, the ground 20a is a separate node from the ground VEE. Employing such a configuration makes it possible to prevent leaking of the high-frequency noise signals directed to the ground VEE of the noise source 20.

The third characteristic of the second configuration example of a DPI test is that the ground 20a of the noise source 20 for inputting a high-frequency noise signal for a malfunction test to the DUT 10 is isolated as a separate node from a ground 50a of the DC power system of the battery 50 or the like for supplying power to the DUT 10.

The ground 20a of the noise source 20 is a common ground, and is placed in a common potential with the system ground of the controller 40 and the detection part 30, as shown in FIG. 9.

Data pertaining to the malfunction power frequency property described above are preferably provided to the user along with the LSI 11. This providing of data makes it possible for the user to utilize the data to avoid LSI 11 malfunctions.

Figure 10:
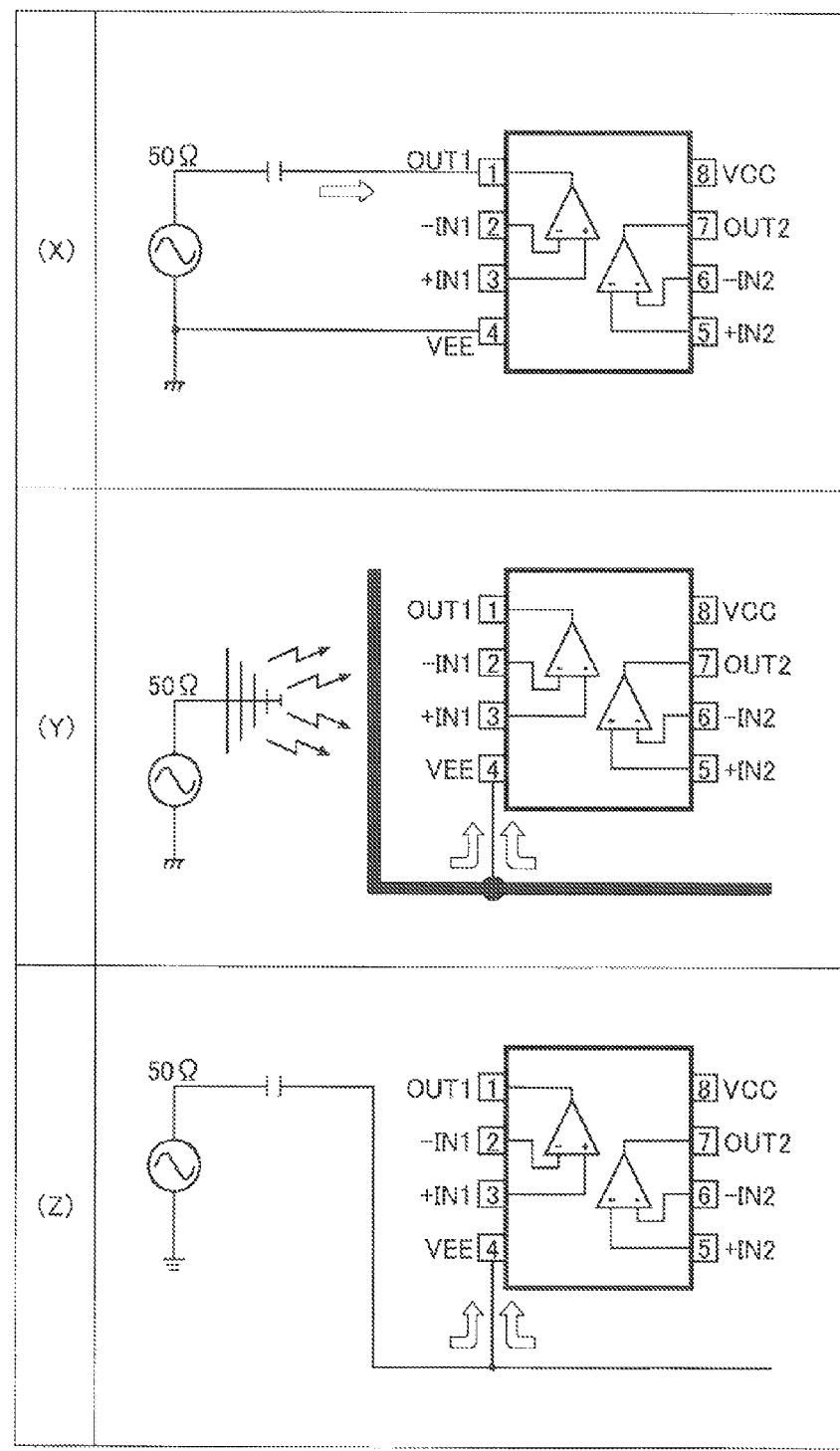
FIG. 10 is a schematic view for comparing the second configuration example of FIG. 9 and another configuration example.

FIG. 10 is a schematic view for comparing the second configuration example of FIG. 9 and another configuration example. The (X) column depicts a configuration in which, similar to the first configuration example, a high-frequency noise signal is injected into an output terminal OUT1 of the LSI at a ground reference. The (Y) column depicts a configuration in which a high-frequency noise signal is injected into the ground terminal VEE of the LSI by emitting interfering radio waves from an antenna toward a chassis. The (Z) column depicts a configuration in which, similar to the second configuration example, a high-frequency noise signal is injected into the ground terminal VEE itself of the LSI.

In the configuration shown in the (X) column, all that can be evaluated is the malfunction when a high-frequency noise signal is injected into a terminal other than the ground terminal VEE of the LSI.

In the configuration shown in the (Y) column, it is possible to evaluate the malfunction when a high-frequency noise signal is injected into the ground terminal VEE of the LSI. With such a configuration, however, the presence of the chassis affects the results of the DPI test.

In the configuration shown in the (Z) column, it is possible to evaluate the malfunction when a high-frequency noise signal is injected into the ground terminal VEE of the LSI without affecting the chassis.

DPI Test

Third Configuration Example

Figure 11:
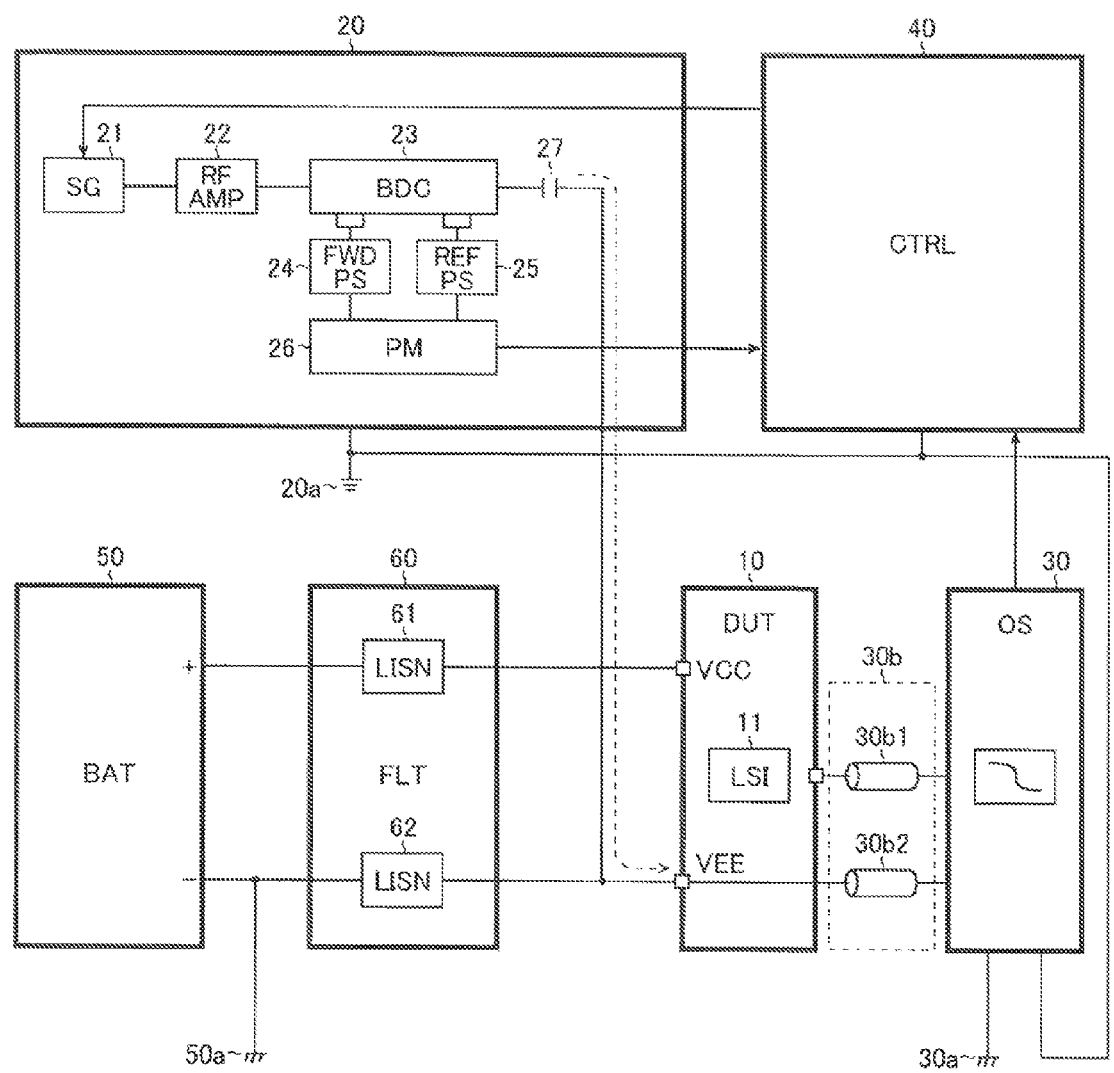
FIG. 11 is a block diagram showing a third configuration example of a DPI test.

FIG. 11 is a block diagram showing the third configuration example of a DPI test. In the third configuration example, similar to the second configuration example, a high-frequency noise signal is inputted to the ground terminal VEE itself of the DUT 10, to find the frequency property (the malfunction power frequency property) of the magnitude of the power at which the LSI 11 causes a malfunction. Configurative elements similar to the second configuration example are denoted by the same symbols in FIG. 9 whereby redundant descriptions are omitted, and the following description focuses on the characterizing portions of the third configuration example.

In the third configuration example of a DPI test, the detection part 30 has a differential input part 30b of high input impedance (1 MΩ)), and a to-be-detected part of the DUT 10 is connected to a first differential input part 30b1, which is one input thereof. The GND terminal (VEE) of the DUT 10 is connected to a second differential input part 30b2, which is the other input of the differential input part 30b. The coupling from the DUT 10 to the detection part 30 is thereby in a pseudo-isolated state, and the presence of the detection part 30 can be prevented from affecting the DPI test. In the detection part 30 of the third configuration example, because there is no need to make the detection reference ground potential of the detection part 30 coincide with the DUT 10, the ground of the detection part 30 may be completely insulated from the ground terminal VEE of the DUT 10, and the detection reference ground 30a is connected to the appropriate potential.

DPI Test

Fourth Configuration Example

Figure 12:
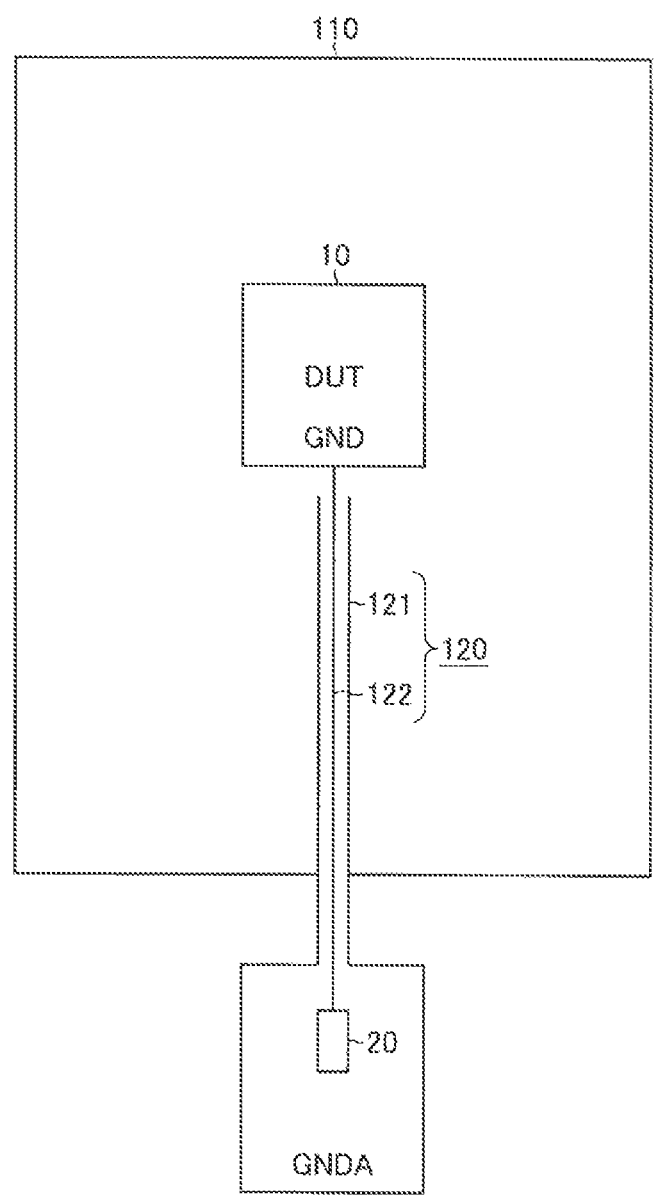
FIG. 12 is a schematic view showing a fourth configuration example of a DPI test.

FIG. 12 is a schematic view showing a fourth configuration example of a DPI test. The fourth configuration example is essentially the same as the previous first through third configuration examples, but this example has the characteristic of having the DUT 10 disposed inside a shield structure 110. In view of this, configurative elements similar to the first through third configuration examples are denoted by the same symbols in FIGS. 1, 9, and 11 whereby redundant descriptions are omitted, and the following description focuses on the characterizing portions of the fourth configuration example.

In the fourth configuration example of a DPI test, the DUT 10 is disposed inside a shield structure 110. The shield structure 110 is a closed space formed from a conductor, and a shield room or shield box commonly used as an electric field shield, for example, is equivalent to the shield structure.

A high-frequency noise signal for a malfunction test is inputted from the noise source 20 to the DUT 10 via a coaxial cable 120. The finding of the frequency property of the magnitude of the power at which the DUT 10 causes a malfunction when the high-frequency noise signal is inputted is the same as the DPI tests of the first through third configuration examples.

The ground (the shield room wall) of the shield structure 110 and the ground (GNDA) of the noise source 20 are short-circuited to each other with a favorable degree of conduction in a DC or AC format. The ground (GND) of the DUT 10 and the ground (GNDA) of the shield structure 110 are isolated from each other.

To give a more specific description of the example of FIG. 12, the coaxial cable 120 running from the noise source 20 to the DUT 10 passes through the shield structure 110 via a through-type N connector or the like. An external conductor (ground wire) 121 of the coaxial cable 120 is short-circuited to the shield structure 110 and isolated from the DUT 10. This therefore fulfills the condition for injecting a high-frequency noise signal into any arbitrary terminal (particularly a ground terminal) provided to the DUT 10.

An internal conductor 122 of the coaxial cable 120 is connected to the DUT 10 as a transmission line for high-frequency noise signals. At this time, the wiring pattern (particularly the GND pattern) of the PCB that receives the injection of the high-frequency noise signals fulfills the roll of a radiation antenna.

Thus, the evaluation device for carrying out the DPI test of the fourth configuration example has a shield structure 110 for placing the DUT 10, a coaxial cable 120 passing through the shield structure 110, and a noise source 20 for inputting high-frequency noise signals for a malfunction test to the DUT 10 through the coaxial cable 120. The coaxial cable 120 has an external conductor 121 short-circuited to the shield structure 110 and isolated from the DUT 10, and an internal conductor 122 connected to the DUT 10 and used for inputting high-frequency noise signals.

<Return Path of High-Frequency Noise Signals>

Figure 13:
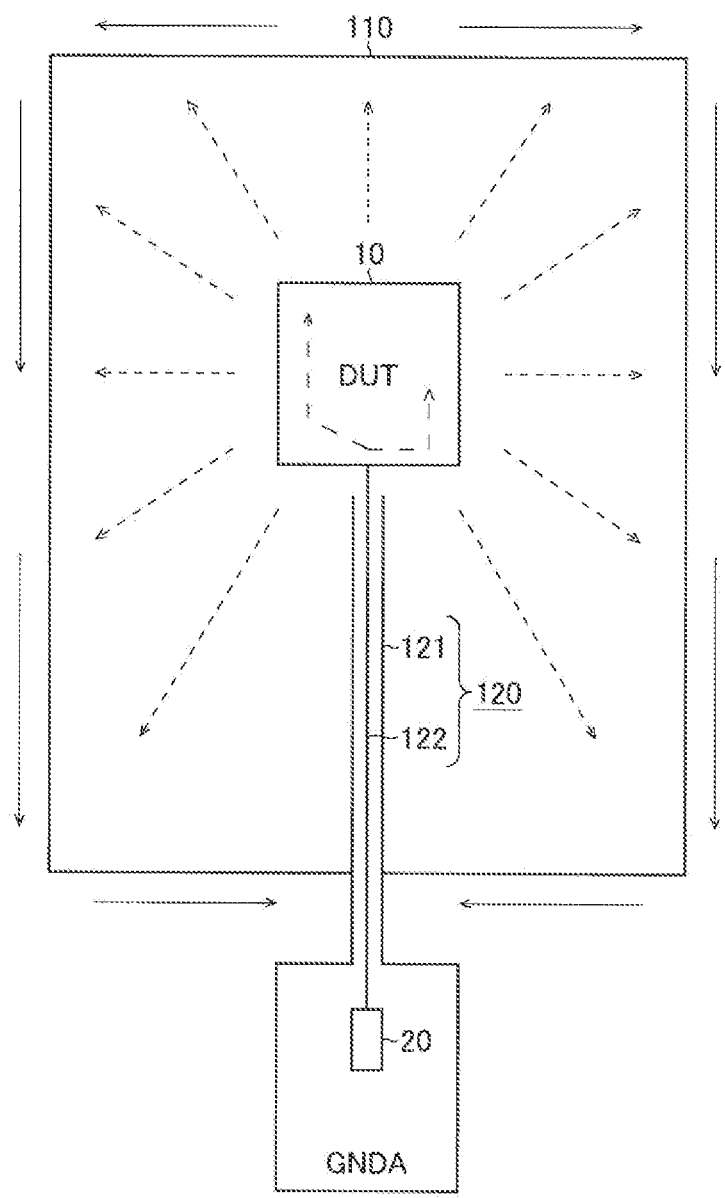
FIG. 13 is a schematic view showing a return path of a high-frequency noise signal.

FIG. 13 is a schematic view showing the return path of high-frequency noise signals. The large-dash arrow inside the DUT 10 represents a noise propagation route through the DUT 10, going through the easiest traversable route from any arbitrary terminal (the ground terminal in this case) to which a high-frequency noise signal is injected. The small-dash arrows pointing from the DUT 10 to the shield structure 110 represent noise propagation routes via radio waves. The solid line arrows along the shield structure 110 represent conduction-hindering noise that returns to the noise source 20 by way of the shield structure 110.

A high-frequency noise signal injected into the ground of the DUT 10 returns to the noise source 20 through the easiest traversable route in accordance with the oscillation frequency. Because the ground (GND) of the DUT 10 and the ground (GNDA) of the shield structure 110 are isolated, the two grounds are bound together by radio waves (refer to the small-dash lines in the drawing). The return path formed through the easiest traversable route via these radio waves is an important requirement in the DPI test of the third configuration example.

In the case of a DPI test carried out without enclosing the DUT 10 in a shield structure 110, there are countless many different routes, depending on the test environment (the structure of the building, the propagation characteristics of the radio waves, etc.), whereby radio waves emitted from the ground (GND) of the DUT 10 return to the ground (GNDA) of the noise source 20, and this variety of routes affects the test results. If the DPI test is carried out with the DUT 10 enclosed in a shield structure 110, the return path is fixed as a route through the shield structure 110, test results that do not depend on the test environment can be achieved, and it will therefore be possible to perform a malfunction evaluation that reflects the actual state of use of the DUT 10.

Data pertaining to the malfunction power frequency property described above is preferably provided to the user along with the LSI 11. This providing of data makes it possible for the user to utilize the data to avoid LSI 11 malfunctions.

<Attachment>

Figure 14:
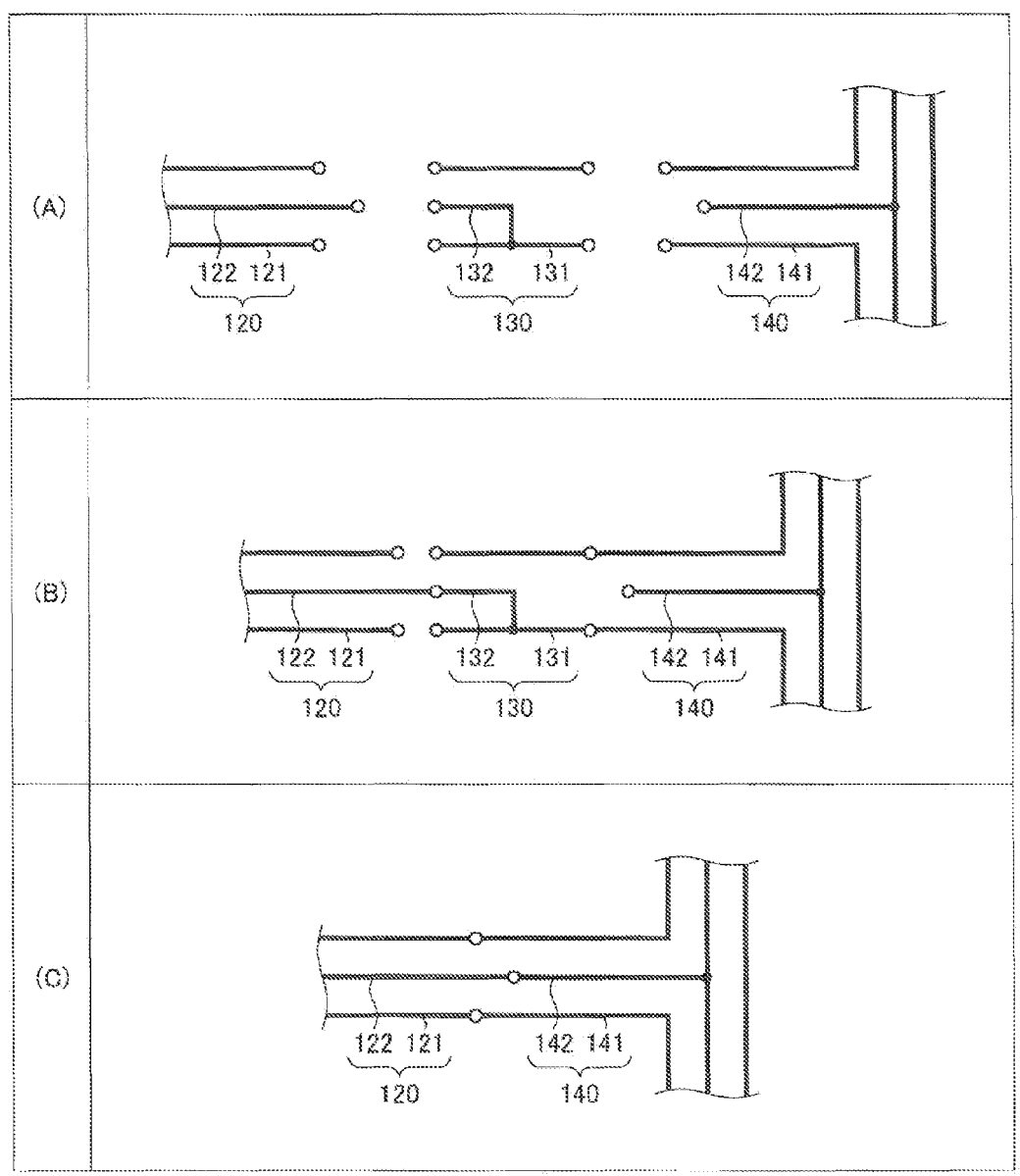
FIG. 14 is a schematic view showing a configuration example of an attachment.

FIG. 14 is a schematic view showing a configuration example of an attachment inserted between the DUT 10 and the coaxial cable 120. Column (A) depicts a state in which the coaxial cable 120, an attachment 130, and a connector 140 provided on the DUT 10 side are separated from each other. Column (B) depicts a state in which the coaxial cable 120 and the connector 140 are connected using the attachment 130. Column (C) depicts a state in which the coaxial cable 120 and the connector 140 are directly connected without the use of the attachment 130.

The attachment 130 of the present configuration example includes an external conductor 131 and an internal conductor 132. While the coaxial cable 120 and the connector 140 are connected using the attachment 130 as shown in column (B), the external conductor 131 of the attachment 130 does not have electrical continuity with the external conductor 121 (GNDA) of the coaxial cable 120, but does have electrical continuity with an external conductor 141 (GND) of the connector 140. The external conductor 121 of the coaxial cable 120 and the external conductor 131 of the attachment 130 are preferably separated from the opposing surface (4 mm) of a flange-securing SMA (sub miniature type A) connector.

The internal conductor 132 of the attachment 130, which is short-circuited at one end to the external conductor 131, does not have electrical continuity with an internal conductor 142 (a signal line) of the connector 140, but does have electrical continuity with the internal conductor 122 (a noise line) of the coaxial cable 120. The external conductor 131 is an open stub of 24 from the point short-circuited to the internal conductor 132 to the open end.

Using the attachment 130 of this configuration makes it extremely easy to connect the internal conductor 122 to the DUT 10 while isolating the external conductor 121 of the coaxial cable 120 from the DUT 10.

If the coaxial cable 120 and the connector 140 are directly connected without using the attachment 130 as shown in column (C), the external conductor 121 and the internal conductor 122 of the coaxial cable 120 can of course be connected with the external conductor 141 and the internal conductor 142 of the connector 140.

<Other Modifications>

The various technical characteristics disclosed in the present specification, in addition to how they are portrayed in the above embodiment, can also be modified in various ways within a range that does not deviate from the technical creative scope of the invention. Specifically, the above embodiment is an example in all points and should not be construed as being limiting, the technical range of the present invention is set forth by the claims rather than the description of the above embodiment, and it should be understood that meanings equivalent with the claims and all variations belonging within their scope are included.

INDUSTRIAL APPLICABILITY

The present invention can be utilized when conducting an EMS evaluation of an onboard LSI, for example.

What is claimed is:

1. An electric circuit evaluation method comprising:
   placing a designated electric circuit inside a shield structure; and
   inputting a noise signal for a malfunction test from a noise source to the designated electric circuit; and
   monitoring, with a controller, an output signal outputted from the designated electric circuit based on the noise signal in order to accumulate malfunction information about the designated electric circuit;
   wherein a short-circuit is established between a ground of the shield structure and a ground of the noise source and the ground of the designated electric circuit and the ground of the shield structure are isolated;
   wherein the noise source comprises:
      a noise signal generator configured to generate the noise signal;
      a separator configured to separate the noise signal into a forward wave component that goes to the designated electric circuit and a reflected wave component that returns from the designated electric circuit;
      a forward wave sensor configured to measure a forward wave power of the forward wave component;
      a reflected wave sensor configured to measure a reflected wave power of the reflected wave component; and
      a transmitter configured to transmit the forward wave power and the reflected wave power to the controller; and
   wherein the controller is configured to calculate and record a power of the noise signal inputted to the designated electric circuit based on a difference between the forward wave power and the reflected wave power.

2. The electric circuit evaluation method of claim 1;
   wherein a coaxial cable from the noise source to the designated electric circuit passes through the shield structure, an external conductor of the coaxial cable being short-circuited to the shield structure and isolated from the designated electric circuit, and an internal conductor of the coaxial cable being connected to the designated electric circuit to input the noise signal.

3. The electric circuit evaluation method of claim 2;
wherein the internal conductor of the coaxial cable is connected to the ground of the designated electric circuit.

4. The electric circuit evaluation method of claim 1, further comprising:
finding a frequency property of the magnitude of the power at which the designated electric circuit causes a malfunction when the noise signal is inputted.

5. An electric circuit provided together with a frequency property of the magnitude of the power at which a malfunction of the electric circuit is caused when the electric circuit is placed inside a shield structure, a noise signal for a malfunction test is inputted from a noise source, a ground short-circuited to a ground of the shield structure and isolated from a ground of the electric circuit being used as a reference,
wherein the frequency property is accumulated as malfunction information about the electric circuit by a controller configured to monitor an output signal outputted from the electric circuit based on the noise signal;
wherein the noise source comprises:
a noise signal generator configured to generate the noise signal;
a separator configured to separate the noise signal into a forward wave component that goes to the electric circuit and a reflected wave component that returns from the circuit;
a forward wave sensor configured to measure a forward wave power of the forward wave component;
a reflected wave sensor configured to measure a reflected wave power of the reflected wave component; and
a transmitter configured to transmit the forward wave power and the reflected wave power to the controller; and
wherein the controller is configured to calculate and record a power of the noise signal inputted to the electric circuit based on a difference between the forward wave power and the reflected wave power.

6. An electric circuit evaluation device for use with a designated circuit, the electric circuit evaluation device comprising:
a shield structure structured to accommodate the designated electric circuit;
a coaxial cable passing through the shield structure;
a noise source configured to input a noise signal for a malfunction test to the designated electric circuit via the coaxial cable; and
a controller configured to monitor an output signal outputted from the designated electric circuit based on the noise signal in order to accumulate malfunction information about the designated electric circuit;
wherein the coaxial cable includes:
an external conductor short-circuited to the shield structure and isolated from the designated electric circuit; and
an internal conductor connected to the designated electric circuit and used for inputting the noise signal;
wherein the noise source comprises:
a noise signal generator configured to generate the noise signal;
a separator configured to separate the noise signal into a forward wave component that goes to the designated electric circuit and a reflected wave component that returns from the designated electric circuit;
a forward wave sensor configured to measure a forward wave power of the forward wave component;
a reflected wave sensor configured to measure a reflected wave power of the reflected wave component; and
a transmitter configured to transmit the forward wave power and the reflected wave power to the controller; and
wherein the controller is configured to calculate and record a power of the noise signal inputted to the designated electric circuit based on a difference between the forward wave power and the reflected wave power.

7. An electric circuit evaluation device comprising:
a test signal feeder configured to input a test signal to a tested circuit; and
a controller configured to monitor an output signal outputted from the tested circuit based on the test signal in order to accumulate malfunction information about the tested circuit,
wherein the test signal feeder includes:
a frequency signal generator configured to generate a frequency signal;
a separator configured to separate the frequency signal into a forward wave component that goes to the tested circuit and a reflected wave component that returns from the tested circuit;
a forward wave sensor configured to measure a forward wave power of the forward wave component;
a reflected wave sensor configured to measure a reflected wave power of the reflected wave component; and
a transmitter configured to transmit the forward wave power and the reflected wave power to the controller, and
wherein the controller is configured to calculate and record a power of the test signal inputted to the tested circuit based on a difference between the forward wave power and the reflected wave power.

8. The electric circuit evaluation device of claim 7, further comprising:
an amplifier configured to amplify the test signal outputted from the test signal feeder.

9. The electric circuit evaluation device of claim 7, further comprising:
a capacitor electrically connected between the tested circuit and the separator.

10. The electric circuit evaluation device of claim 7,
wherein the test signal feeder outputs the test signal such that, while a frequency of the test signal is kept constant, an amplitude of the test signal increases with time.

* * * * *